US007009117B2

(12) United States Patent
Torii

(10) Patent No.: US 7,009,117 B2
(45) Date of Patent: Mar. 7, 2006

(54) PRINTED CIRCUIT BOARD AND STRUCTURE FOR SOLDERING ELECTRONIC PARTS THERETO

(75) Inventor: Satoshi Torii, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 209 days.

(21) Appl. No.: 10/618,593

(22) Filed: Jul. 15, 2003

(65) Prior Publication Data

US 2004/0011556 A1    Jan. 22, 2004

(30) Foreign Application Priority Data

Jul. 19, 2002    (JP) .............................. 2002-210791

(51) Int. Cl.
*H01R 12/04* (2006.01)
*H05K 1/11* (2006.01)

(52) U.S. Cl. ....................... 174/262; 174/255; 174/260
(58) Field of Classification Search ................. 29/839, 29/837; 174/260, 262–266, 255
See application file for complete search history.

(56) References Cited

U.S. PATENT DOCUMENTS 6,137,061 A * 10/2000 Aponte et al. ............. 174/260

6,849,805 B1 * 2/2005 Honda et al. ............... 174/250

FOREIGN PATENT DOCUMENTS

| GB | 2246731 A | * | 2/1992 |
| JP | 7-10971 | | 2/1995 |
| JP | 2000-196215 | | 7/2000 |

* cited by examiner

*Primary Examiner*—Kamand Cuneo
*Assistant Examiner*—Jeremy Norris
(74) *Attorney, Agent, or Firm*—Wenderoth, Lind & Ponack, L.L.P.

(57) ABSTRACT

A printed circuit board, which is guaranteed to be free of defective soldering in mounting and connecting electric or electronic parts or devices to the printed circuit, has a circuit pattern printed on its substrate, and an anti-soldering layer is laid on the circuit pattern to prevent soldering material from sticking to the circuit pattern and silk-screen printing areas are laid on the anti-soldering layer to indicate where selected electric or electronic parts or devices are to be mounted. Each silk-screen printing area has terminal holes made therein. The board has a substrate-exposed zone traversing the silk-screen printing area to leave its opposite extensions open to the surrounding atmosphere, thereby allowing heated air and gases to escape from the interspace between the bottom of the electric or electronic part or device and the exposed substrate.

3 Claims, 4 Drawing Sheets

PRINTED CIRCUIT BOARD AND STRUCTURE FOR SOLDERING ELECTRONIC PARTS THERETO

BACKGROUND OF THE INVENTION

1. Field of the Invention

The present invention relates to a printed circuit board and soldering structure assuring complete soldering of the terminal leads of electric or electronic parts or devices to its circuit pattern.

2. Related Art

Large-sized condensers are mounted onto a printed circuit board with their terminal leads soldered to selected conductors of the printed circuit. When a large-sized condenser whose diameter is 20 or more millimeters is soldered to a printed circuit, soldering trouble is often caused. Referring to FIG. 4, such a large-sized condenser 51 is put on a printed circuit board 52 with its terminal leads 53 in the terminal holes 54, and then, the terminal leads 53 are soldered to selected conductors 55 of the printed circuit pattern.

As seen from the drawing, the terminal leads 53 are bent in the terminal holes 54 to be caught and fixedly held in the holes 54, lest the condenser 51 should fall off when the printed circuit board 52 is inclined or turned upside down, or lest the condenser 52 should float when the printed circuit board 52 is dipped in the melted solder bath. As is well known, the printed circuit board 52 is brought to the flux bath where flux is applied to the bent terminal leads 53 of the condenser 51 for the purpose of preventing their oxidization, and then they are dried and heated preliminary to soldering. Then, the printed circuit board passes through the dip-soldering bath.

The flux is diluted to be low in viscosity, so that the flux may rise up in the terminal holes 54 under the influence of capillary attraction. Thus, the flux oozes out of the terminal holes 54 to form a flux layer 57 on the board surface in the space 58 delimited by the circular leg 56 of the condenser 51. As a result the substrate-and-condenser interspace 58 is sealed to be airtight.

The printed circuit board 52 is heated in soldering the terminal leads 53 to selected conductors 55 in the printed circuit pattern, and then, the air confined in the airtight space 58 is expanded, and at the same time, the flux layer 57 is vaporized. The expanded air and gaseous flux makes a vent hole through the soldering filet in the terminal hole 54, thus making the soldering defective. When the entrapped air shrinks in the closed space 58, the melted solder is drawn from the terminal hole 54 to spread in the closed space 58 and bridge a gap between the terminal leads 53, thus establishing a short circuit therebetween.

In an attempt to solve such a problem, JP 7-10971(U) entitled "Electronic Parts Mounting Structure" proposes that: 1) a vent hole is made in a selected site of the substrate where an electrolytic condenser is to be mounted; 2) a notched spacer is laid between the substrate and the electrolytic condenser to allow the expanded air and gaseous flux to escape through the notch or cut of the spacer; and 3) a projection is formed on the substrate to raise the electrolytic condenser, thus defining the open space around the condenser bottom for degassing.

Such a vent hole cannot be large enough to allow the expanding air and vaporized gaseous flux to escape completely. Use of an extra spacer or projection on the substrate increases work and cost in manufacturing printed circuits.

Similar trouble will be caused in soldering to the printed circuit board any other electric or electronic part or device whose bottom is so shaped as to form a closed space between its bottom and the board surface. Even in soldering a flat-bottomed electric or electronic part or device having its terminal leads extending from the flat bottom, such as a LED, the flux rises up in the terminal holes under the influence of capillary attraction to form a flux layer between the substrate surface and the flat bottom of the overlying electric or electronic part or device. When dipped and heated in the melted solder bath, the flux layer is vaporized, and the gaseous flux makes a vent hole in the solder fillet of the terminal hole so that it may escape outside.

Referring to FIG. 5, JP 2000-196215(A) entitled "Printed Circuit Board" proposes that a number of strips 59 are arranged on the substrate to be sandwiched between the substrate and the overlying electric or electronic part or device, so that the vent gaps may be made around the bottom of the electric or electronic part or device. The total thickness of the strip and creamy solder coating printed on the strip need to provide a vent space large enough to permit complete degassing. Sometimes such spacer-and-solder coating is not thick enough, and then, incomplete degassing is caused with the result that the heated air and gas is ejected through the solder-filled terminal holes, leading to the incomplete soldering.

In view of the above one object of the present invention is to provide a printed circuit board which permits complete degassing from the space between overlying electronic parts or devices and the board surface, thereby assuring reliable soldering of the electric or electronic parts or devices to the printed circuit.

Another object of the present invention is to provide a soldering structure for soldering electric or electronic parts or devices to printed circuits.

SUMMARY OF THE INVENTION

To attain these objects a circuit board having circuit patterns printed on its opposite sides, the substrate of which circuit board has a circuit pattern printed on each side, an anti-soldering layer lying on the circuit pattern to prevent soldering material from sticking to the circuit pattern and at least one silk-screen printing area lying on the anti-soldering layer to indicate where a selected electric or electronic part or device is to be mounted, the silk-screen printing area having at least one terminal hole made at its center, is improved according to the present invention in that the board has a substrate-exposed zone traversing the silk-screen printing area, and that the terminal hole has a conductor layer formed on its inner circumference.

The conductor layer may be contiguous to the circuit pattern.

A soldering structure for a circuit board having circuit patterns printed on its opposite sides, the substrate of which circuit board has a circuit pattern printed on each side, an anti-soldering layer lying on the circuit pattern to prevent soldering material from sticking to the circuit pattern and at least one silk-screen printing area lying on the anti-soldering layer to indicate where a selected electric or electronic part or device is to be mounted, the silk-screen printing area having at least one terminal hole made at its center, is improved according to the present invention in that the board has a substrate-exposed zone traversing the silk-screen printing area, thereby forming a space between the exposed substrate surface and the bottom of the electric or electronic part r device, which is laid on the silk-screen printing area with its terminal lead or leads passing through the terminal hole or holes, each terminal hole having a conductor layer formed on its inner circumference, the annular space defined by the terminal lead and the surrounding conductor layer in the terminal hole being filled with soldering material.

The three layers (i.e., the copper circuit layer, the soldering inhibition layer and the silk-screen layer) are removed from a selected site of the printed circuit board allotted to a selected electric or electronic part or device to be mounted, thus leaving a sufficient vent gap large enough to assure complete degassing from the interspace between the board surface and the overlying electric or electronic part or device.

Advantageously the negative pressure is caused by degassing from the interspace to draw the melted solder into the terminal hole, joining to the conductor layer in the terminal hole to provide reliable soldering and fixedly hold the electric or electronic part or device with increased strength.

Other objects and advantages of the present invention will be understood from the following description of a printed circuit board according to one preferred embodiment of the present invention, which is shown in the accompanying drawings.

DETAILED DESCRIPTION OF PREFERRED EMBODIMENT

Figure 1:
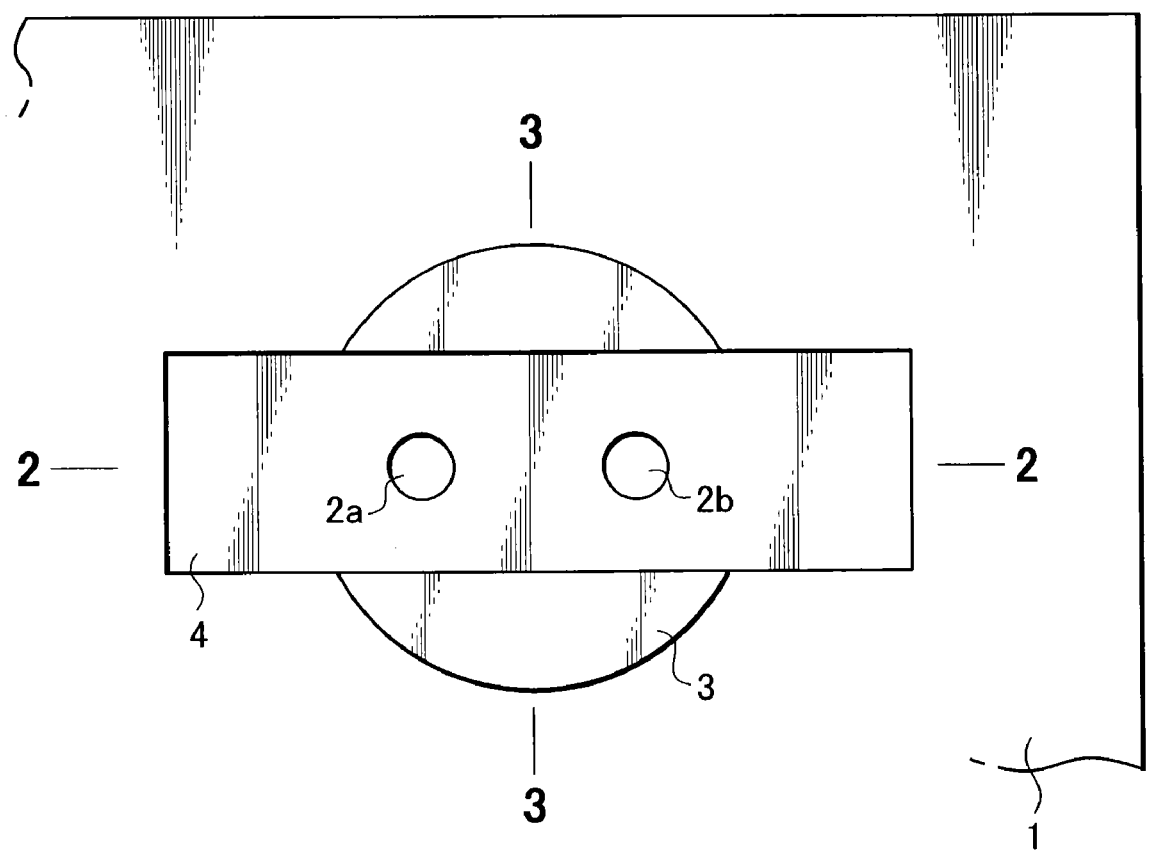
FIG. 1 is a plan view of a fragment of a printed circuit board according to the present invention.
Figure 2:
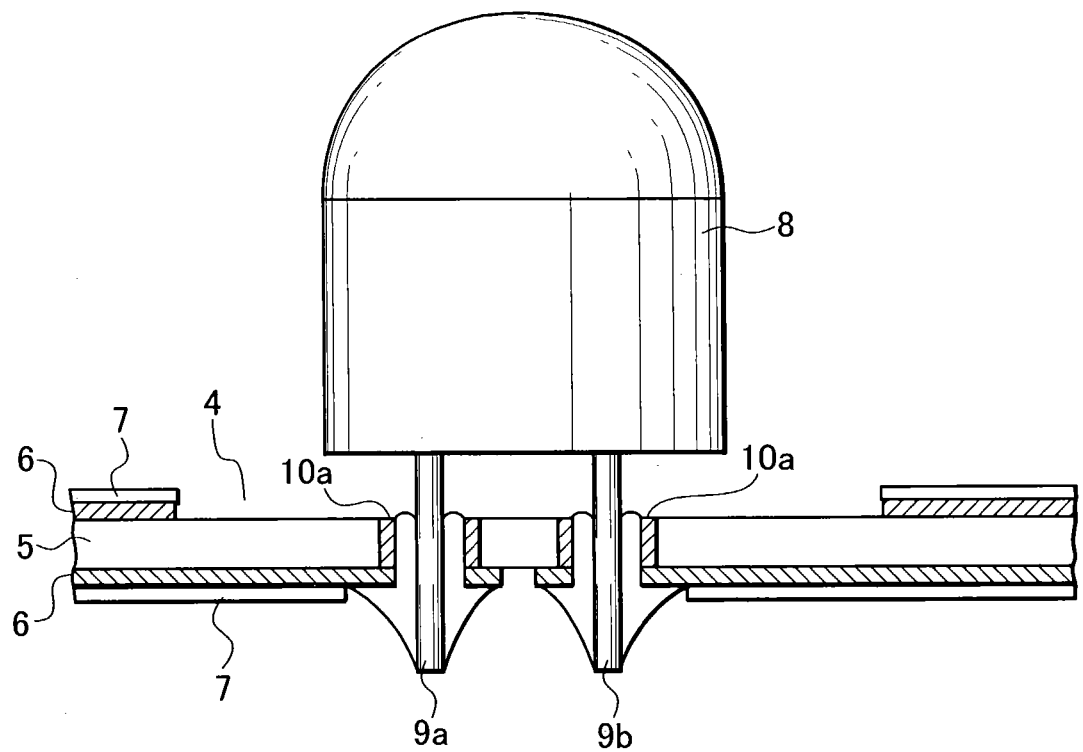
FIG. 2 is sectional view of the printed circuit board taken along the line 2—2 in FIG. 1.
Figure 3:
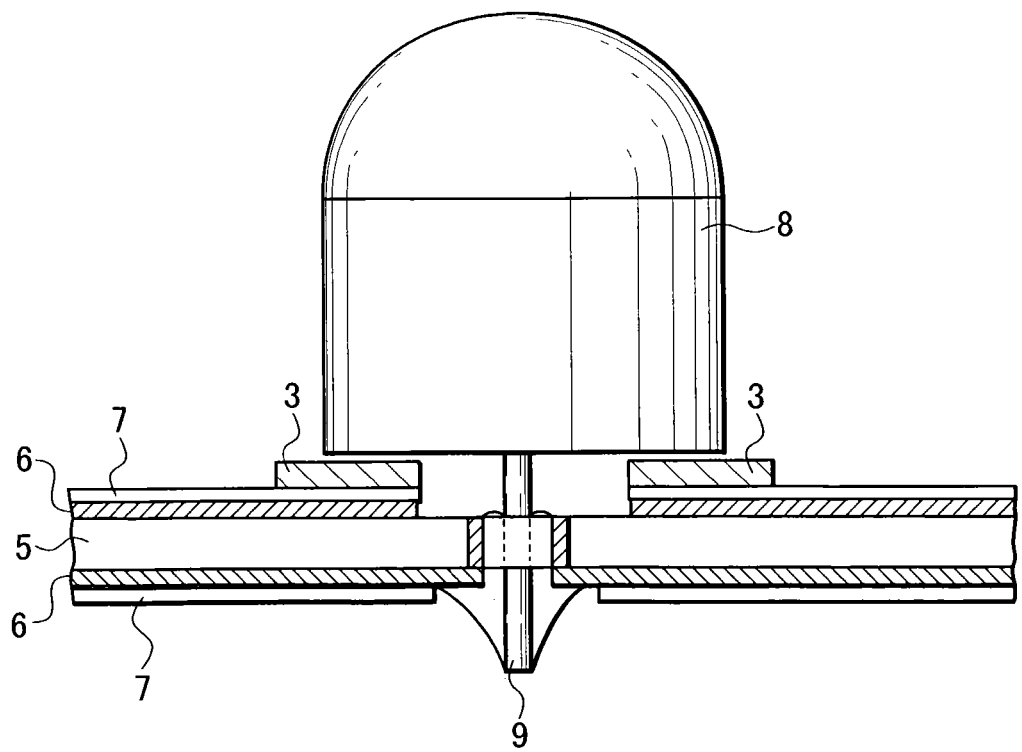
FIG. 3 is another sectional view of the printed circuit board taken along the line 3—3 in FIG. 1.
Figure 4:
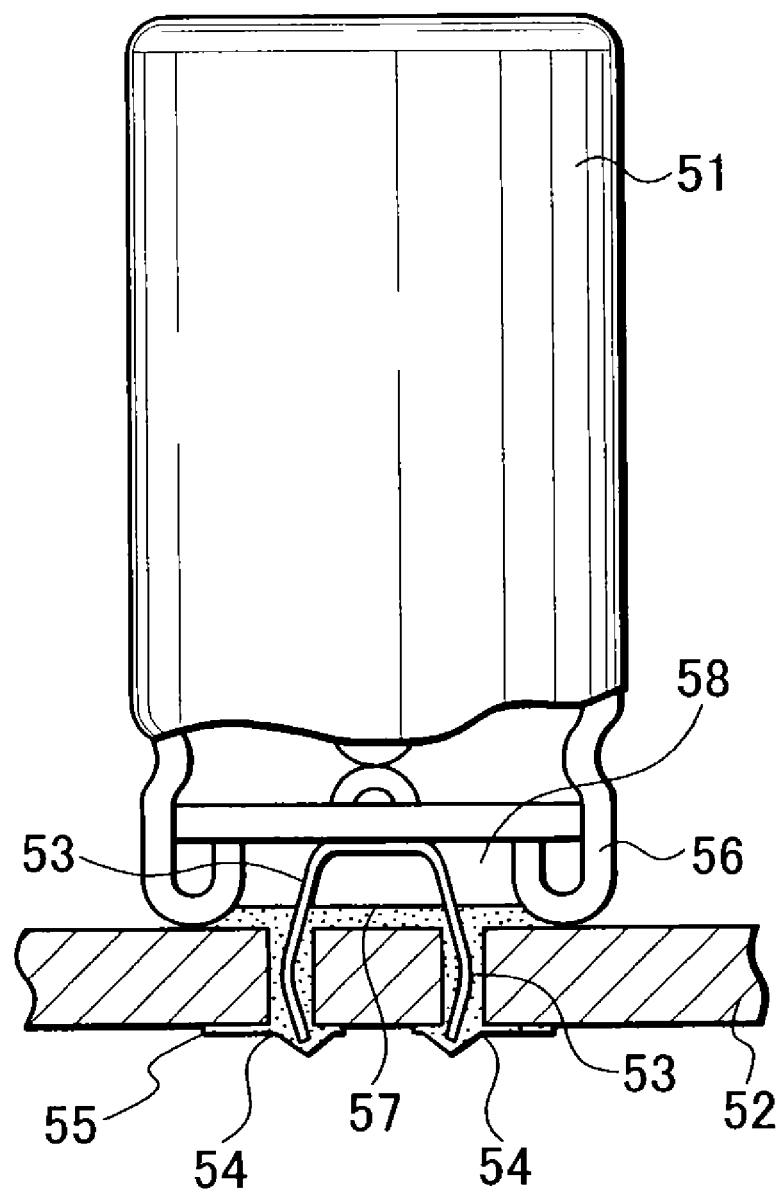
FIG. 4 illustrates an electrolytic condenser mounted on a conventional printed circuit board.
Figure 5:
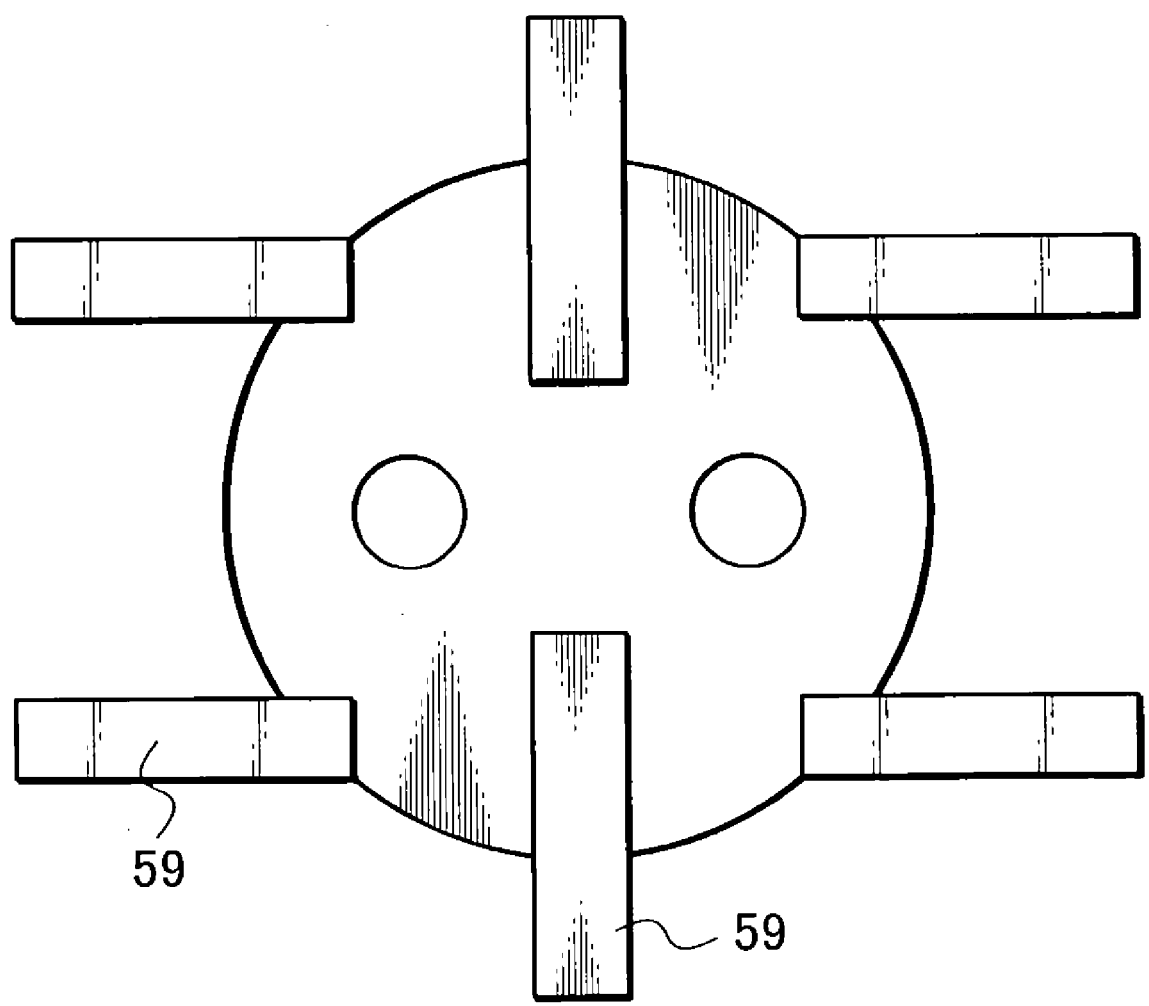
FIG. 5 illustrates a plan view of another conventional printed circuit board.

Referring to FIG. 1, a printed circuit board 1 has circuit patterns printed on its upper and lower surfaces. Electric or electronic parts or devices are mounted onto the opposite surfaces of the printed circuit board. Referring to FIGS. 2 and 3, the circuit patterns 6 are printed on the opposite sides of the substrate 5. An anti-soldering layer 7 lies on each circuit pattern 6 to prevent soldering material from sticking to the circuit pattern 6. A silk-screen printing area 3 lies on the anti-soldering layer 7 to indicate where a selected electric or electronic part or device 8 is to be mounted. Two terminal holes 2a and 2b are made in the silk-screen printing area 3. The terminal leads 9a and 9b of the electric or electronic part or device 8 are inserted in the terminal holes 2a and 2b. Each terminal hole has a conductor layer 10a or 10b formed on its inner circumference. The conductor layer 10a or 10b is contiguous to the circuit pattern 6.

The board has a substrate-exposed zone 4 traversing the silk-screen printing area 3 to open on its opposite ends. The substrate-exposed zone 4 is formed by removing the copper layer (circuit pattern) 6, the soldering inhibition layer 7 and the silk-screen layer 3 from a selected site of the printed circuit board, which is allotted to the selected electric or electronic part or device 8 to be mounted, leaving opposite sectors of the circular silk-screen printing area 3 unremoved, still indicating where the selected electric or electronic part or device is put (see FIG. 1).

The three layers are removed to expose an elongated rectangular zone of substrate, which traverses diametrically and extends beyond the circular silk-screen printing area. Thus, there is provided a sufficient vent gap, which is large enough to assure complete degassing from the interspace defined between the board surface and the overlying electric or electronic part device 8.

Referring to FIGS. 1, 2 and 3 again, the electric or electronic part or device 8 is laid on the silk-screen printing area 3 with its terminal leads 9a and 9b inserted in the terminal holes 2a and 2b, and the substrate-exposed zone 4 traverses the silk-screen printing area 3 to open on its opposite ends. Thus, the interspace between the bottom of the electric or electronic part or device 8 opens on the opposite sides of the overlying electric or electronic part or device 8.

When the terminal leads 9a and 9b of the electric or electronic part or device 8 are soldered to the conductor layers 10a and 10b and to the printed circuit pattern 6, and when the flux, which is applied to the terminal leads 9a and 9b and surrounding conductor layer and circuit to be soldered, comes up in the terminal holes 2a and 2b, the flux cannot seal the interspace between the bottom of the electric or electronic part or device 8, and the heated and expanding air and vaporized flux are allowed to flow out from the opposite open spaces of the substrate-exposed zone 4. Thus, the electric or electronic part or device 8 is completely soldered to the printed circuit pattern 6.

What is claimed is:

1. A circuit board including:
   a substrate;
   at least one circuit pattern provided on opposite sides of said substrate;
   an anti-soldering layer provided on said at least one circuit pattern on one side of said substrate to prevent soldering material from sticking to said at least one circuit pattern;
   at least one silk-screen printing area provided on said anti-soldering layer to indicate where a selected electric or electronic part or device is to be mounted;
   at least one terminal hole formed in said substrate at a center of said at least one silk-screen printing area;
   a conductor layer formed on an inner circumference of said at least one terminal hole;
   a substrate-exposed zone provided on said one side of said substrate, said substrate-exposed zone being free of said at least one circuit pattern, said anti-soldering layer and said at least one silk-screen printing area, such that said one side of said substrate is exposed in said substrate-exposed zone;
   wherein said substrate-exposed zone is a contiguous substrate-exposed zone that extends continuously across a portion of said one side of said substrate and between portions of said at least one silk-screen printing area so as to extend across said center of said at least one silk-screen printing area where said at least one terminal hole is formed.

2. A circuit board according to claim 1, wherein
   said conductor layer formed on said inner circumference of said at least one terminal hole is contiguous to said at least one circuit pattern.

3. A soldering structure for soldering a selected electric or electronic part or device having at least one terminal lead on a circuit board, including:
   a substrate;
   at least one circuit pattern provided on opposite sides of said substrate;

an anti-soldering layer provided on said at least one circuit pattern on one side of said substrate to prevent soldering material from sticking to said at least one circuit pattern;

at least one silk-screen printing area provided on said anti-soldering layer to indicate where the selected electric or electronic part or device is to be mounted;

at least one terminal hole formed in said substrate at a center of said at least one silk-screen printing area;

a conductor layer formed on an inner circumference of said at least one terminal hole;

a substrate-exposed zone provided on said one side of said substrate, said substrate-exposed zone being free of said at least one circuit pattern, said anti-soldering layer and said at least one silk-screen printing area, such that said one side of said substrate is exposed in said substrate-exposed zone;

wherein said substrate-exposed zone is a contiguous substrate-exposed zone that extends continuously across a portion of said one side of said substrate and between portions of said at least one silk-screen printing area so as to extend across said center of said at least one silk-screen printing area where said at least one terminal hole is formed, such that, when the selected electric or electronic part or device is mounted on the at least one silk-screen printing area on said one side of said substrate with the at least one terminal lead passing through said at least one terminal hole, a space is formed between said exposed substrate surface of said substrate in said substrate-exposed zone and a bottom of the selected electric or electronic part or device, and at least one annular space respectively defined between the at least one terminal lead and the conductor layer is filled with soldering material.

* * * * *